(12) United States Patent
Moon et al.

(10) Patent No.: US 10,831,115 B1
(45) Date of Patent: Nov. 10, 2020

(54) RETICLE MANAGEMENT METHOD AND SEMICONDUCTOR DEVICE FABRICATION METHOD INCLUDING THE SAME

(71) Applicant: SAMSUNG ELECTRONICS CO., LTD., Suwon-si (KR)

(72) Inventors: Yongseung Moon, Yongin-si (KR); Sungyong Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/774,543

(22) Filed: Jan. 28, 2020

(30) Foreign Application Priority Data

Jul. 19, 2019 (KR) ........................ 10-2019-0087409

(51) Int. Cl.
  *G03F 7/20* (2006.01)
  *H01L 21/673* (2006.01)

(52) U.S. Cl.
  CPC ...... *G03F 7/70925* (2013.01); *G03F 7/70591* (2013.01); *H01L 21/67359* (2013.01)

(58) Field of Classification Search
  CPC .... G03F 7/70741; G03F 1/66; G03F 7/70916; G03F 7/70933; G03F 7/7075; G03F 7/70925; G03F 1/82; G03F 7/70691; H01L 21/67359
  See application file for complete search history.

(56) References Cited

U.S. PATENT DOCUMENTS

| | | | |
|---|---|---|---|
| 6,327,021 B1 | 12/2001 | Higashiguchi | |
| 6,589,354 B2 | 7/2003 | Reid | |
| 9,122,177 B2 | 9/2015 | Jeong et al. | |
| 9,164,399 B2 | 10/2015 | Wang et al. | |
| 9,636,718 B2 | 5/2017 | Chiang et al. | |
| 10,067,418 B2 | 9/2018 | Chang et al. | |
| 10,234,766 B2 | 3/2019 | Ota | |
| 2005/0091781 A1* | 5/2005 | Yang | B08B 5/00 15/303 |
| 2005/0121144 A1* | 6/2005 | Edo | G03F 7/70925 156/345.32 |
| 2011/0180108 A1* | 7/2011 | Pan | G03F 1/66 134/21 |
| 2012/0325269 A1* | 12/2012 | Rebstock | H01L 21/68707 134/18 |
| 2014/0007371 A1* | 1/2014 | Lu | B05C 13/02 15/339 |
| 2015/0370179 A1* | 12/2015 | Suzuki | G03F 7/70733 355/72 |

FOREIGN PATENT DOCUMENTS

| | | |
|---|---|---|
| JP | 2000-019717 A | 1/2000 |
| JP | 2014-106311 A | 6/2014 |
| KR | 10-2006-0075920 A | 7/2006 |
| KR | 10-2011-0011961 A | 2/2011 |

* cited by examiner

*Primary Examiner* — Steven Whitesell Gordon
(74) *Attorney, Agent, or Firm* — Lee IP Law, P.C.

(57) ABSTRACT

Disclosed are reticle management methods and semiconductor device fabrication methods. The reticle management method includes inspecting a reticle using a first inspection method, inspecting a reticle pod storing the reticle using a second inspection method different from the first inspection method, and cleaning the reticle pod when a particle is present on the reticle pod.

19 Claims, 8 Drawing Sheets

RETICLE MANAGEMENT METHOD AND SEMICONDUCTOR DEVICE FABRICATION METHOD INCLUDING THE SAME

CROSS-REFERENCE TO RELATED APPLICATION

Korean Patent Application No. 10-2019-0087409, filed on Jul. 19, 2019, in the Korean Intellectual Property Office, and entitled: "Reticle Management Method and Semiconductor Device Fabrication Method Including the Same," is incorporated by reference herein in its entirety.

BACKGROUND

1. Field

Embodiments relate to a method of fabricating a semiconductor device, and more particularly, to a reticle management method and a semiconductor device fabrication method including the same.

2. Description of the Related Art

With the advance of information technology, research and development for highly integrated semiconductor devices are actively being conducted. Degrees of integration of semiconductor devices may be mainly determined by the wavelength used for photolithography. The light source may include an I-line source, a G-line source, an excimer laser source, e.g., a krypton fluoride (KrF) and an argon fluoride (ArF) light source, and an extreme ultraviolet (EUV) light source having a wavelength shorter than that of excimer laser sources. The EUV light source has energy much larger than that of the excimer laser source. The EUV light source may produce particle contamination of an EUV reticle. The contaminated EUV reticle may need to be cleaned or replaced.

SUMMARY

According to some example embodiments, a reticle management method may include inspecting a reticle using a first inspection method, inspecting a reticle pod using a second inspection method different from the first inspection method, the reticle pod storing the reticle, and cleaning the reticle pod when a particle is present on the reticle pod.

According to some example embodiments, a reticle management method may include using an optical inspection method to inspect a reticle, determining whether a particle is absent on the reticle, cleaning the reticle when the particle is present on the reticle, providing the reticle to an exposure apparatus when the particle is absent on the reticle, using an air blowing method to inspect a reticle pod that is to store the reticle, determining whether the particle is absent on the reticle pod, and cleaning the reticle pod when the particle is present on the reticle pod.

According to some example embodiments, a semiconductor device fabrication method may include inspecting a reticle and a reticle pod that receives the reticle, using the reticle to perform a substrate exposure process, and storing the reticle and the reticle pod when the reticle is exchanged.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
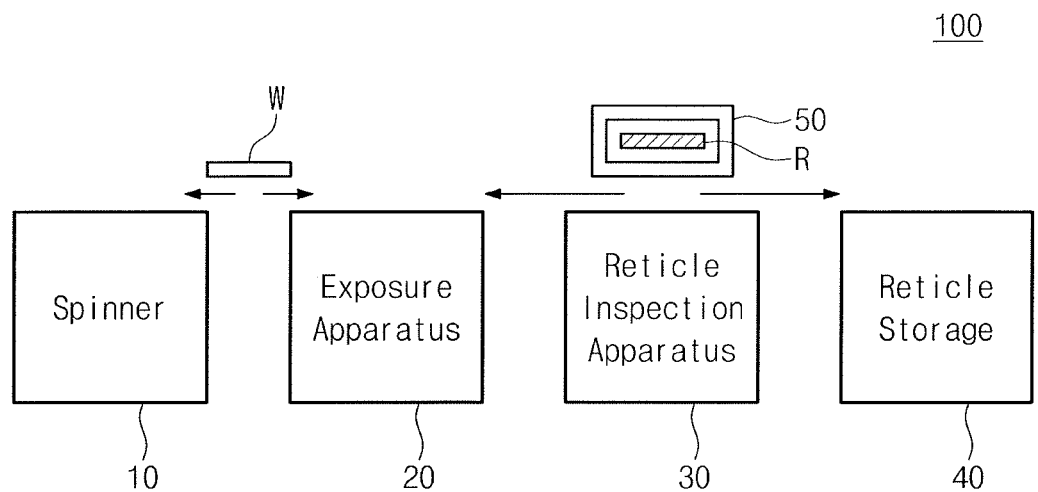
FIG. 1 illustrates an example of a semiconductor device fabrication facility according to an embodiment.

FIG. 1 illustrates an example of a semiconductor device fabrication facility 100 according to an embodiment. Referring to FIG. 1, the semiconductor device fabrication facility 100 according to an embodiment may be a photolithography apparatus. The semiconductor device fabrication facility 100 may form a photoresist pattern on a substrate W. For example, the semiconductor device fabrication facility 100 may include a spinner 10, an exposure apparatus 20, a reticle inspection apparatus 30, and a reticle storage 40.

The substrate W may be transferred between the spinner 10 and the exposure apparatus 20. The spinner 10 and the exposure apparatus 20 may form a photoresist pattern on the substrate W. The spinner 10 may be installed adjacent to the exposure apparatus 20. The spinner 10 may perform a photoresist coating process and an exposure process. The exposure apparatus 20 may use a reticle R to perform a photoresist exposure process. For example, the exposure apparatus 20 may be an extreme ultraviolet (EUV) exposure apparatus, and the reticle R may be an EUV reticle. The reticle R may be transferred from the exposure apparatus 20 to the reticle inspection apparatus 30 and the reticle storage 40 whenever the reticle R is exchanged or replaced. The reticle R may be smaller than the substrate W.

The reticle R may be received in a reticle pod 50. The reticle R and the reticle pod 50 may be inspected in the reticle inspection apparatus 30 and stored in the reticle storage 40. The reticle pod 50 may prevent the reticle R from being damaged or contaminated with particles (see operation 60 of FIG. 70). A conveyor, e.g., an overhead hoisting transfer (OHT) and the like, may transfer the reticle pod 50 to the exposure apparatus 20, the reticle inspection apparatus 30, and the reticle storage 40. The reticle inspection apparatus 30 may be installed between the exposure apparatus 20 and the reticle storage 40. The reticle inspection apparatus 30 may inspect the reticle R and particles (see operation 60 of FIG. 7) on the reticle pod 50. The reticle storage 40 may temporarily or permanently store the reticle R.

Figure 2:
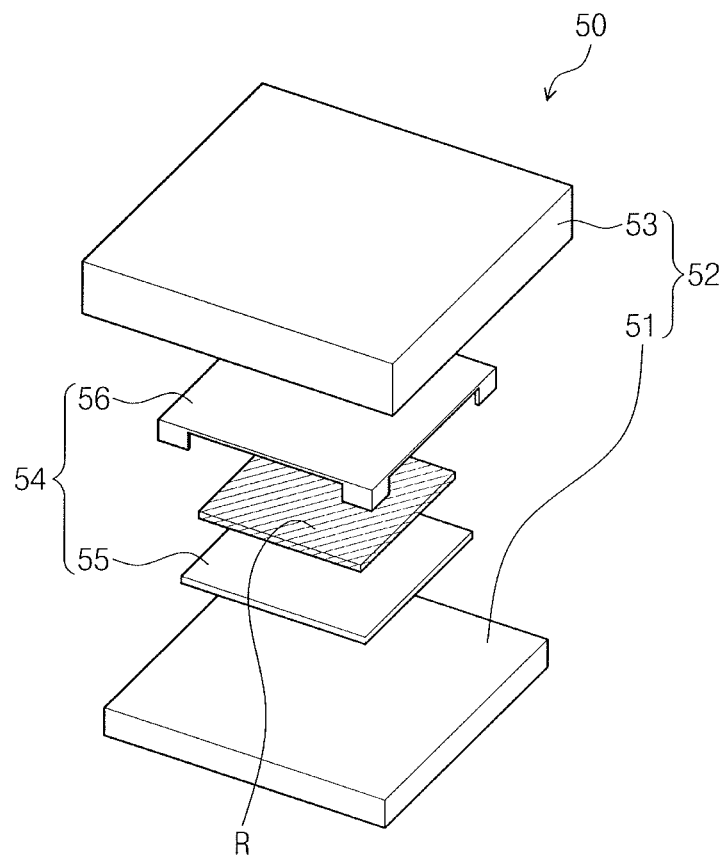
FIG. 2 illustrates an exploded perspective view showing an example of a reticle and a reticle pod depicted in FIG. 1.

FIG. 2 shows an example of the reticle R and the reticle pod 50 illustrated in FIG. 1. Referring to FIG. 2, the reticle pod 50 may include a dual pod. Alternatively, the reticle pod 50 may include a single pod. For example, the reticle pod 50 may include an outer pod 52 and an inner pod 54.

The outer pod 52 may surround, e.g., completely enclose, and protect the inner pod 54. For example, the outer pod 52 may include malleable material, e.g., plastic, rubber, an organic polymer, and the like. The outer pod 52 may include a first base 51 and a first cover 53. The first base 51 may support the inner pod 54. The first cover 53 may cover, e.g., completely cover, the first base 51 and the inner pod 54.

The inner pod 54 may be disposed in the outer pod 52. The inner pod 54 may receive and protect the reticle R. The inner pod 54 may seal the reticle R. The inner pod 54 may be formed of metal, for example, iron, aluminum, tungsten, molybdenum, nickel, an alloy thereof, and the like. The inner pod 54 may include a second base 55 and a second cover 56. The second base 55 may support the reticle R. The second cover 56 may cover the second base 55 and the reticle R.

The reticle R may be provided between the second base 55 and the second cover 56. The reticle R may be a photomask. The reticle R may include a base substrate and reflective layers on the base substrate. The base substrate may include a quartz substrate, a metal substrate, a silicon substrate, and the like. The reflective layers may be disposed on the base substrate. Each of the reflective layers may include a silicon layer and a molybdenum layer. For example, each of the reflective layers may have a thickness of about 14 nm.

Figure 3:
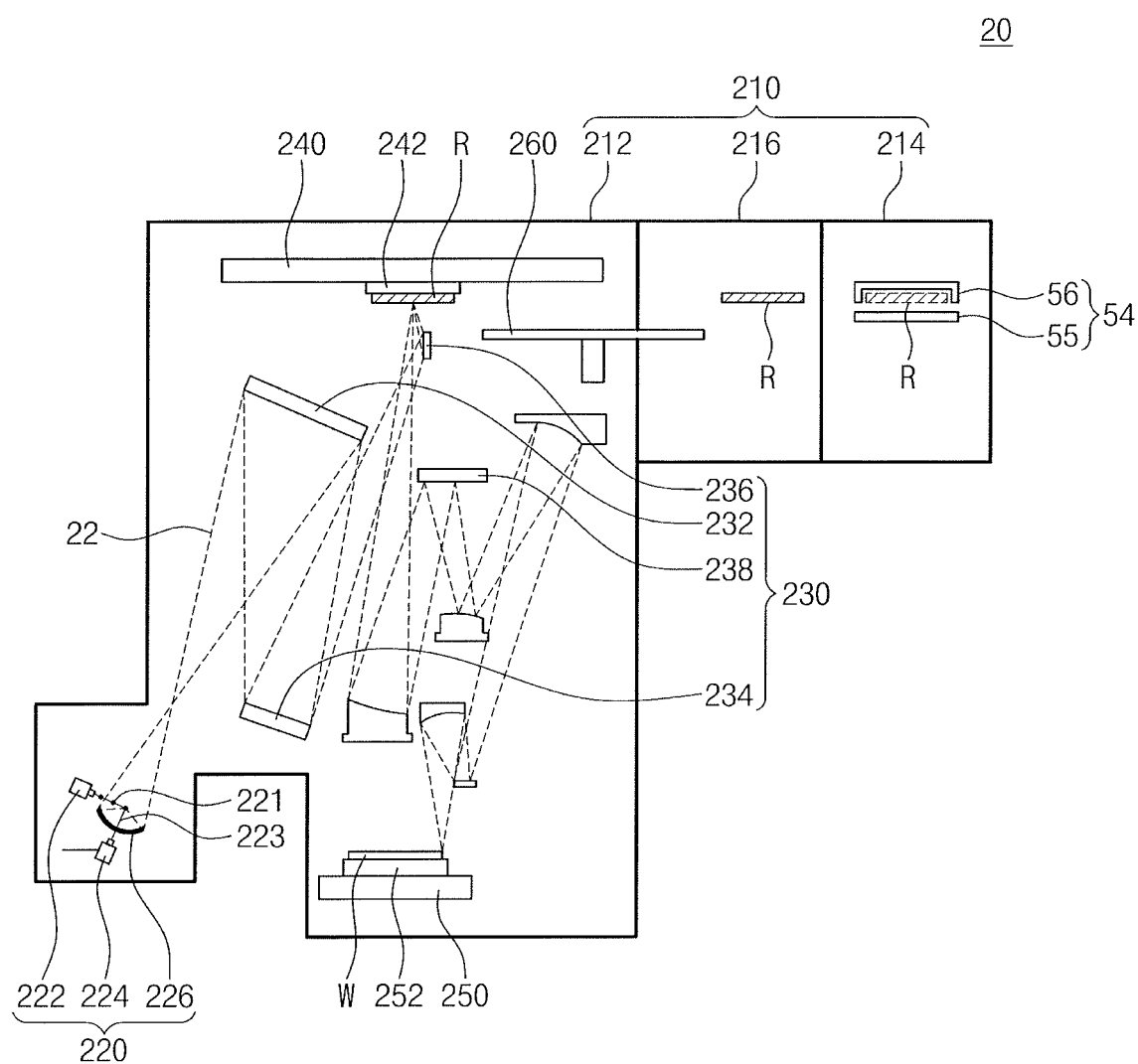
FIG. 3 illustrates an example of an exposure apparatus depicted in FIG. 1.

FIG. 3 shows an example of the exposure apparatus 20 illustrated in FIG. 1.

Referring to FIG. 3, the exposure apparatus 20 may include an EUV scanner or an EUV exposure tool. For example, the exposure apparatus 20 may include a chamber 210, an EUV source 220, an optical system 230, a first reticle stage 240, a substrate stage 250, and a rapid exchange device 260.

The chamber 210 may provide an isolated space for the substrate W and the reticle R from the outside, e.g., a cleanroom. For example, the chamber 210 may have a vacuum pressure, for example, ranging from about $1\times10^{-4}$ Torr to about $1\times10^{-6}$ Torr. The chamber 210 may include a main chamber 212, a first auxiliary chamber 214, and a second auxiliary chamber 216. The main chamber 212 may surround the EUV source 220, the optical system 230, the first reticle stage 240, and the substrate stage 250. The first auxiliary chamber 214 may be spaced apart from the main chamber 212. The first auxiliary chamber 214 may temporarily store the inner pod 54 and the reticle R inside the inner pod 54. The outer pod 52 may be separated from the inner pod 54 outside the first auxiliary chamber 214, and the inner pod 54 may be provided into the first auxiliary chamber 214. The second auxiliary chamber 216 may be between the main chamber 212 and the first auxiliary chamber 214. The second auxiliary chamber 216 may connect the first auxiliary chamber 214 to the main chamber 212. The second auxiliary chamber 216 may temporarily store the reticle R. The inner pod 54 may be separated from the reticle R inside the first auxiliary chamber 214, and the reticle R may be provided into the second auxiliary chamber 216.

The EUV source 220 may be disposed in one side of the main chamber 212. The EUV source 220 may generate an EUV beam 22. The EUV beam 22 may be a plasma beam. For example, the EUV source 220 may include a source droplet generator 222, a first laser 224, and a collector mirror 226. The source droplet generator 222 may generate a source droplet 221. The source droplet 221 may include a liquid droplet of tin (Sn), titanium (Ti), lithium (Li), or the like. The first laser 224 may provide the source droplet 221 with a first laser beam 223 to produce the EUV beam 22. The first laser beam 223 may be a pump light for the EUV beam 22. The EUV beam 22 may have intensity in proportion to intensity or power of the first laser beam 223. The collector mirror 226 may focus the EUV beam 22 onto the optical system 230. For example, the collector mirror 226 may include a concave mirror.

The optical system 230 may be disposed between the first reticle stage 240 and the substrate stage 250 which face each other. The optical system 230 may provide the EUV beam 22 to the reticle R and the substrate W in the foregoing sequence to form an optical path between the first reticle stage 240 and the substrate stage 250. For example, the optical system 230 may include a field facet mirror 232, a pupil facet mirror 234, a grazing mirror 236, and projection mirrors 238. The field facet mirror 232, the pupil facet mirror 234, and the grazing mirror 236 may be used as an illumination system that provides the reticle R with the EUV beam 22. The field facet mirror 232 may reflect the EUV beam 22 to the pupil facet mirror 234. The pupil facet mirror 234 may reflect the EUV beam 22 to the reticle R. The field facet mirror 232 and the pupil facet mirror 234 may collimate the EUV beam 22. The grazing mirror 236 may be disposed between the pupil facet mirror 234 and the reticle R. The grazing mirror 236 may control a grazing incident angle of the EUV beam 22. The projection mirrors 238 may be used as projection objectives that provide the substrate W with the EUV beam 22. The projection mirrors 238 may provide the EUV beam 22 to the substrate W.

The first reticle stage 240 may be disposed in an upper side of the main chamber 212. The first reticle stage 240 may have a reticle chuck 242. The reticle chuck 242 may use an electrostatic voltage to electrostatically hold the reticle R. For example, the reticle R may be a reflective mask. The reticle R may reflect a first portion of the EUV beam 22 to the projection mirrors 238 and may absorb a second portion of the EUV beam 22. The projection mirrors 238 may reflect the reflected portion of the EUV beam 22 to the substrate W. The reticle R may be contaminated with a product (e.g., a material of the source droplet 221) of the EUV beam 22. For example, the reticle R may be contaminated with particles (see 60 of FIG. 7). The particles 60 may be nano-particles of Sn, Ti, Li, and the like.

The substrate stage 250 may be disposed in a lower side of the main chamber 212 to face the first reticle stage 240. The substrate stage 250 may have a substrate chuck 252. The substrate chuck 252 may load the substrate W. The substrate chuck 252 may electrostatically hold the substrate W. The substrate W may be exposed to the EUV beam 22. A photoresist on the substrate W may be partially exposed to light, based on a pattern of the reticle R.

The rapid exchange device 260 may be disposed between the first reticle stage 240 and the first auxiliary chamber 214. The rapid exchange device 260 may exchange the reticle R on the reticle chuck 242. The rapid exchange device 260 may transfer the reticle R between the reticle chuck 242 and the second auxiliary chamber 216.

At least one robot arm may be provided inside or outside the first auxiliary chamber 214. The robot arm may separate or combine the outer pod 52 from or with the inner pod 54 outside the first auxiliary chamber 214. The robot arm may load or unload the inner pod 54 into or from the first auxiliary chamber 214. The robot arm may separate or combine the inner pod 54 from or with the reticle R inside the first auxiliary chamber 214. In addition, the robot arm may transfer the reticle R between the first auxiliary chamber 214 and the second auxiliary chamber 216.

Figure 4:
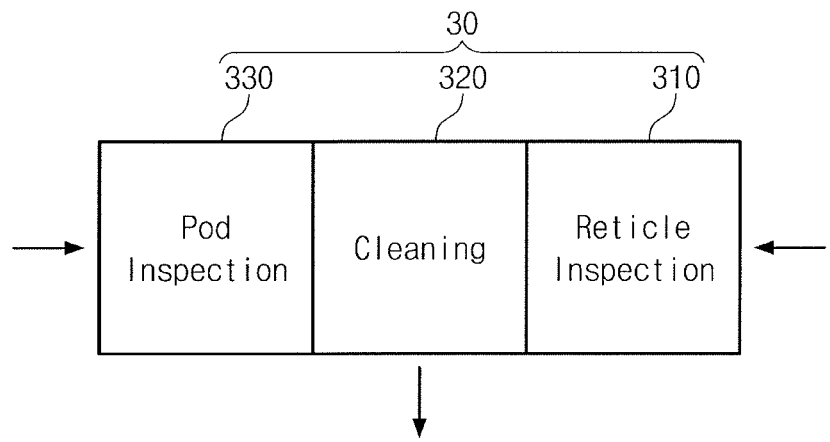
FIG. 4 illustrates an example of an inspection apparatus depicted in FIG. 1.

FIG. 4 shows an example of the reticle inspection apparatus 30 illustrated in FIG. 1. Referring to FIG. 4, the reticle inspection apparatus 30 may include a reticle inspection module 310, a cleaning module 320, and a pod inspection module 330.

The reticle inspection module 310 may be placed on one side of the cleaning module 320. The reticle inspection module 310 may inspect the reticle R. The cleaning module 320 may be placed between the pod inspection module 330 and the reticle inspection module 310. The cleaning module 320 may clean the reticle R and the reticle pod 50. The pod inspection module 330 may be placed on other side of the cleaning module 320. The pod inspection module 330 may inspect the reticle pod 50. Although not shown, the reticle inspection apparatus 30 may further include an interface module that separates or loads the reticle R from or into the reticle pod 50.

Figure 5:
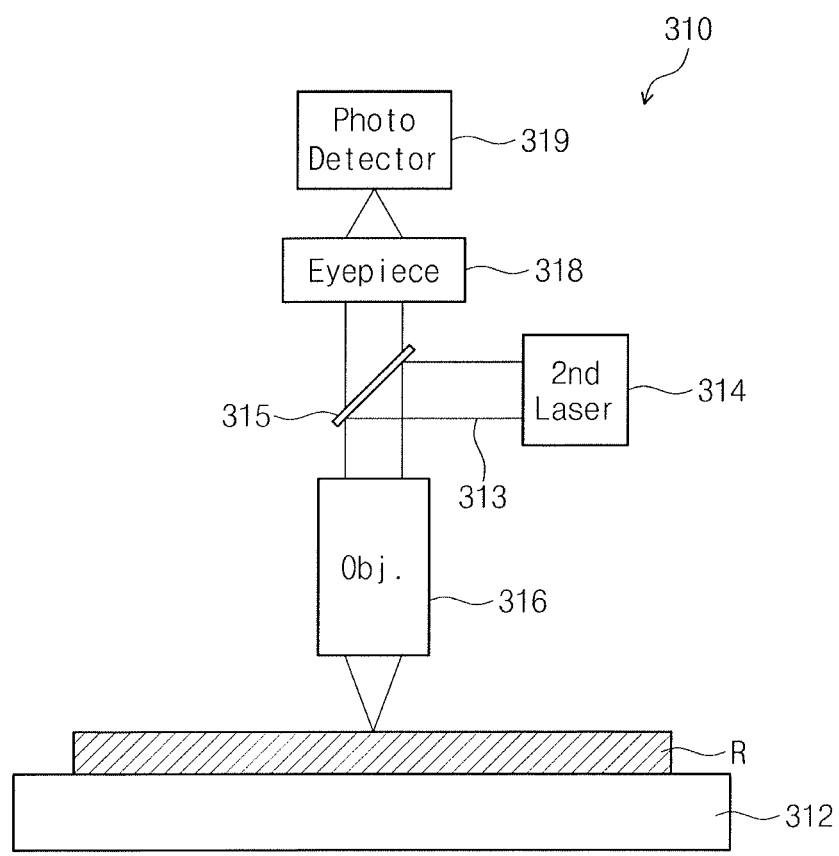
FIG. 5 illustrates an example of a reticle inspection module depicted in FIG. 4.

FIG. 5 shows an example of the reticle inspection module 310 illustrated in FIG. 4. Referring to FIG. 5, the reticle inspection module 310 may include an optical spectroscopy system. For example, the reticle inspection module 310 may include a second reticle stage 312, a second laser 314, a half-mirror 315, an objective 316, an eyepiece 318, and a photodetector 319. The second reticle stage 312 may load the reticle R thereon. The second laser 314 may generate a second laser beam 313. The second laser beam 313 may include an ArF ultraviolet ray (e.g., a wavelength of 193 nm). The half-mirror 315 may be disposed between the objective 316 and the eyepiece 318, and may reflect the second laser beam 313 to the objective 316. The objective 316 may provide the second laser beam 313 to the reticle R and may receive the second laser beam 313 reflected from the reticle R. The second laser beam 313 may pass through the half-mirror 315 and the eyepiece 318, and then may be provided to the photodetector 319. The photodetector 319 may detect the second laser beam 313 to determine the presence of particle contamination on the reticle R. Alternatively, the photodetector 319 may determine whether the reticle R is damaged.

Figure 6:
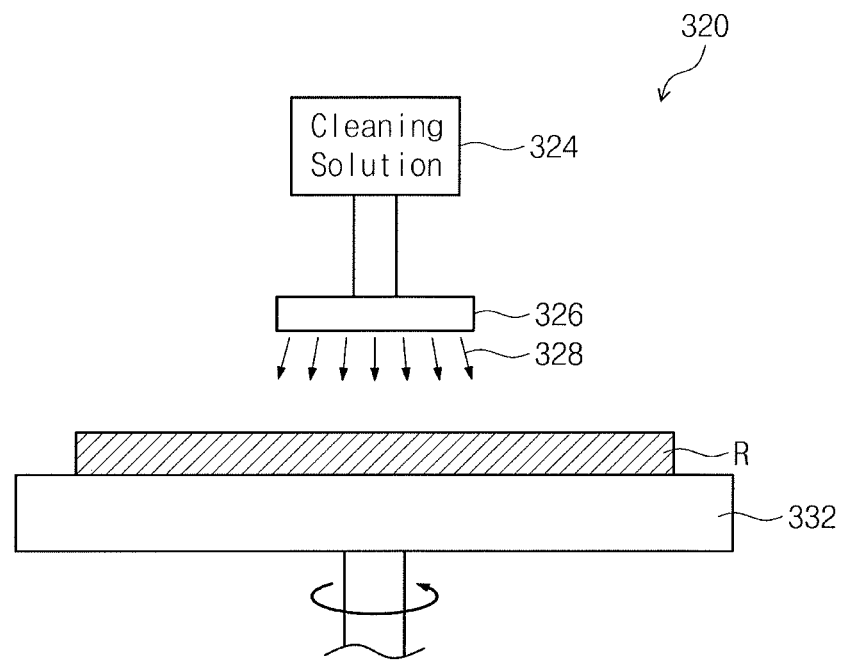
FIG. 6 illustrates an example of a cleaning module depicted in FIG. 4.

FIG. 6 shows an example of the cleaning module 320 illustrated in FIG. 4. Referring to FIG. 6, the cleaning module 320 may be a wet cleaning module of a spin wet cleaning apparatus or a deep wet cleaning apparatus. Alternatively, the cleaning module 320 may be a dry cleaning module. For example, the cleaning module 320 may include a spin chuck 322, a cleaning solution supply 324, and a cleaning solution nozzle 326. The spin chuck 322 may rotate the reticle R or the reticle pod 50. The cleaning solution supply 324 may supply the cleaning solution nozzle 326 with a cleaning solution 328. The cleaning solution nozzle 326 may be disposed above the spin chuck 322. The cleaning solution nozzle 326 may be connected to the cleaning solution supply 324. The cleaning solution nozzle 326 may provide the cleaning solution 328 either onto the reticle R on the spin chuck 322 or onto the reticle pod 50 on the spin chuck 322, thereby cleaning the reticle R or the reticle pod 50. The cleaning solution 328 may include an acidic or alkaline chemical.

Figure 7:
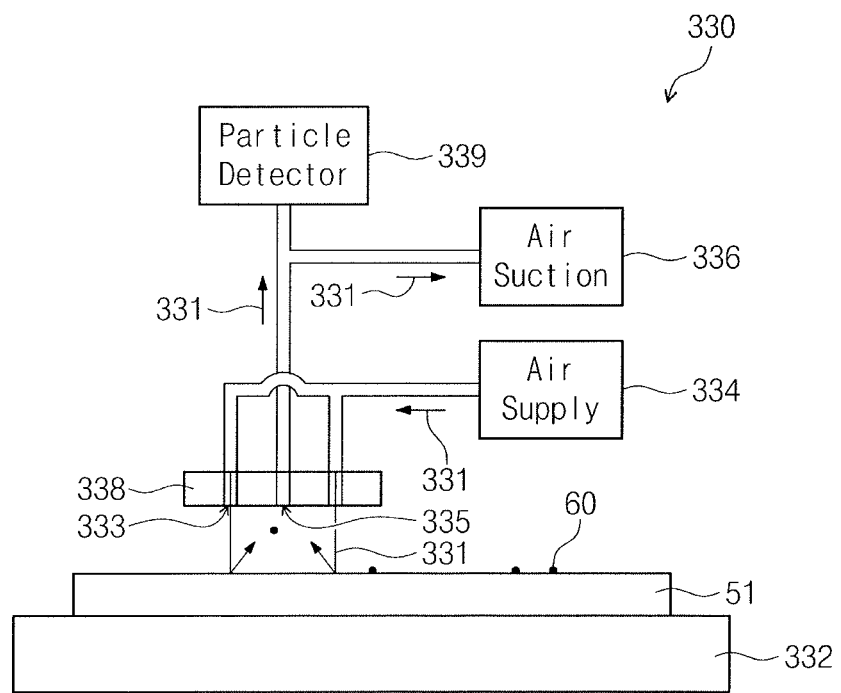
FIG. 7 illustrates an example of a pod inspection module depicted in FIG. 4.

FIG. 7 shows an example of the pod inspection module 330 illustrated in FIG. 4. Referring to FIG. 7, the pod inspection module 330 may include a particle analyzer or air blowing inspection tool. The pod inspection module 330 may use an air blowing inspection method to inspect the reticle pod 50, thereby increasing productivity. When an optical inspection method is used to inspect the reticle pod 50, the inspection of the reticle pod 50 may lead to a reduction in productivity and an increase in time and cost. The pod inspection module 330 may include, for example, a pod stage 332, an air supply 334, an air suction part 336, an air nozzle part 338, and a particle detector 339.

The pod stage 332 may support the first base 51 of the reticle pod 50. The pod stage 332 may support the first cover 53, the second base 55, or the second cover 56, and the like.

The air supply 334 may be connected to the air nozzle part 338. The air supply 334 may supply the air nozzle part 338 with air 331. The air 331 may include a nitrogen gas, an argon gas, or a helium gas.

The air suction part 336 may be connected to the air nozzle part 338. The air suction part 336 may inhale the air 331 through the air nozzle part 338.

The air nozzle part 338 may be provided above the pod stage 332. The air nozzle part 338 may inject the air 331 to the first base 51 of the reticle pod 50 and may inhale the air 331. For example, the air nozzle part 338 may have air nozzles 333 and an air intake 335. The air nozzles 333 may be disposed adjacent to the air intake 335. For example, the air intake 335 may be in a center of the air nozzle part 338 and the air nozzles 333 may be at edges, e.g., a periphery, of the air nozzle part 338. The air 331 may be provided through the air nozzles 333 onto the first base 51 of the reticle pod 50. The air 331 may separate particles 60 from the first base 51 of the reticle pod 50. The air 331 may be inhaled through the air intake 335 and then provided to the particle detector 339.

The particle detector 339 may be connected between the air nozzle part 338 and the air intake 335. The particle detector 339 may detect the particles 60 in the inhaled air 331.

The pod inspection module 330 may analyze the detected particles 60 and determine whether the first base 51 or any portion of the reticle pod 50 is contaminated with the particles 60.

The following will explain a semiconductor device fabrication method that uses the semiconductor device fabrication facility 100 configured as described above.

Figure 8:
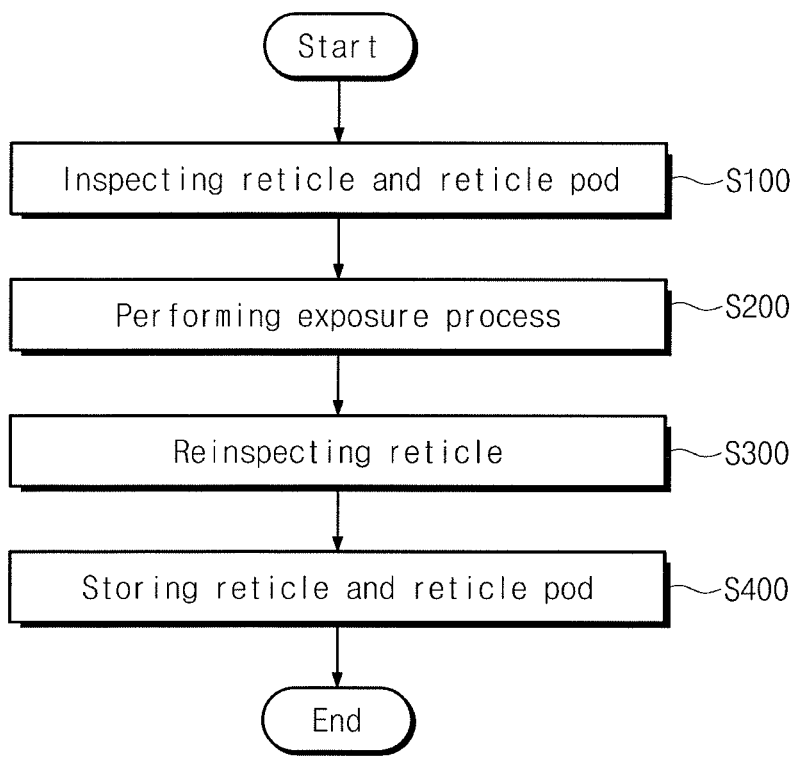
FIG. 8 illustrates a flow chart showing a semiconductor device fabrication method according to an embodiment.

FIG. 8 shows a semiconductor device fabrication method according to an embodiment. Referring to FIG. 8, a semiconductor device fabrication method according to an embodiment may include an operation S100 of inspecting the reticle R and the reticle pod 50, an operation S200 of performing an exposure process, an operation S300 of reinspecting the reticle R, and an operation S400 of storing the reticle R and the reticle pod 50.

Referring to FIGS. 4 and 8, the reticle inspection apparatus 30 may inspect the reticle R and the reticle pod 50 (S100). The interface module of the reticle inspection apparatus 30 may separate the reticle R from the outer and inner pods 52 and 54 of the reticle pod 50. The reticle inspection apparatus 30 may inspect the reticle R prior to the reticle pod 50. Alternatively, the reticle inspection apparatus 30 may inspect the reticle R and the reticle pod 50 at the same time.

Figure 9:
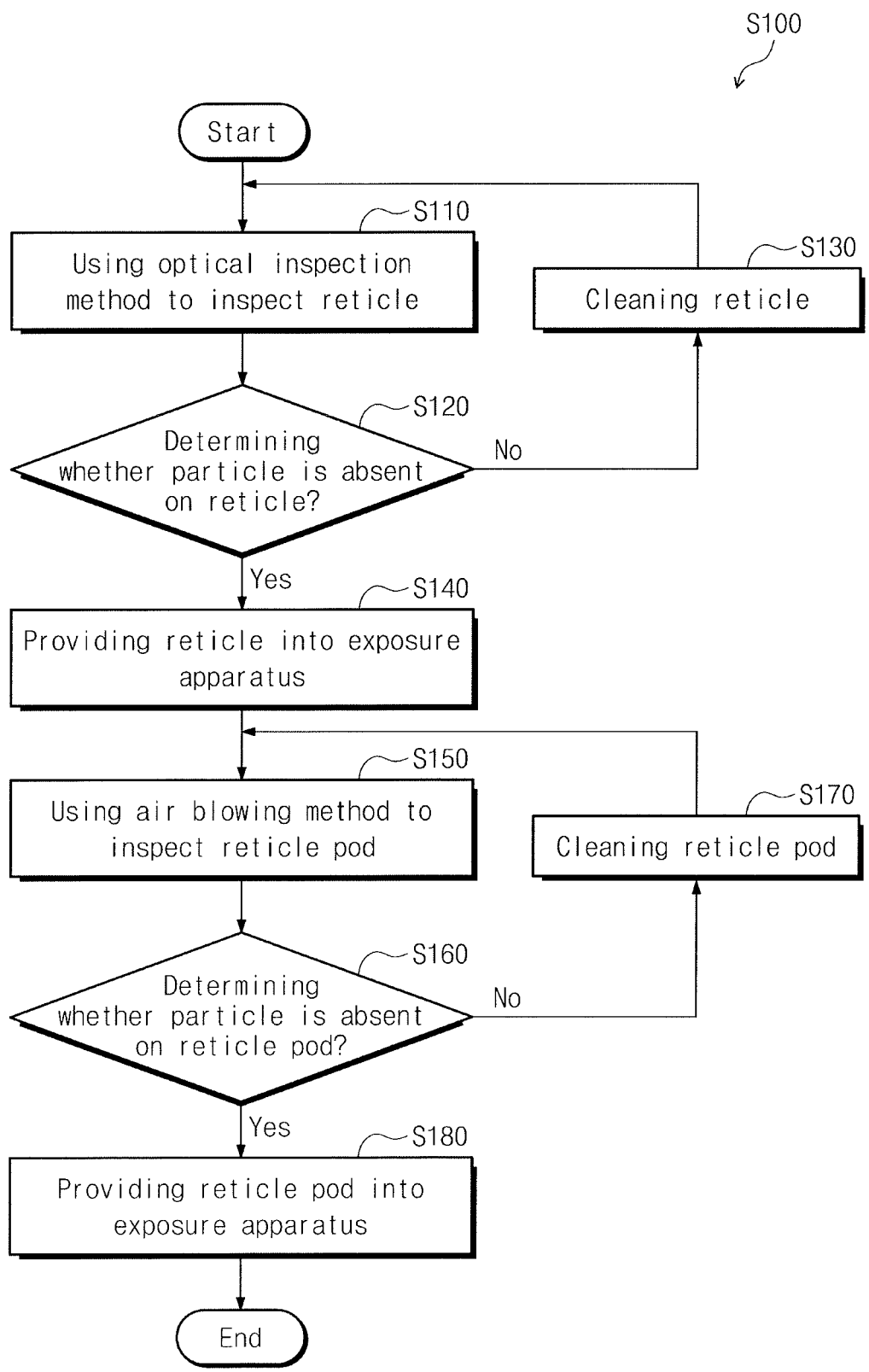
FIG. 9 illustrates a flow chart showing an example of an inspection step in FIG. 8.

FIG. 9 shows an example of the inspection operation S100 in FIG. 8. Referring to FIG. 9, the operation S100 of inspecting the reticle R and the reticle pod 50 may include an operation S110 of using an optical inspection method to inspect the reticle R, an operation S120 of determining whether the particle 60 is absent on the reticle R, an operation S130 of cleaning the reticle R when the particle 60 is present on the reticle R, an operation S140 of providing the reticle R into the exposure apparatus 20, an operation S150 of using an air blowing method to inspect the reticle pod 50, an operation S160 of determining whether the particle 60 is absent on the reticle pod 50, and an operation S170 of cleaning the reticle pod 50 when the particle 60 is absent on the reticle pod 50.

Referring to FIGS. 5 and 9, the reticle inspection module 310 of the reticle inspection apparatus 30 may use an optical inspection method to inspect the reticle R (S110). The second laser 314 and the objective 316 of the reticle inspection module 310 may provide the reticle R with the second laser beam 313, and the photodetector 319 may detect the second laser beam 313 reflected by the reticle R.

A controller of the reticle inspection apparatus 30 may use a detection signal of the second laser beam 313 to determine whether the particle 60 is present on the reticle R (S120).

When the particle 60 is present on the reticle R, the cleaning module 320 may clean the reticle R (S130). Referring to FIG. 6, the reticle R may be cleaned in a wet method. When the cleaning of the reticle R is completed, the operation S110 may be repeated to use an optical inspection method to inspect the reticle R, and then the step S120 may be repeated to determine whether the particle 60 is absent on the reticle R.

When the particle 60 is absent on the reticle R, a robot arm or an OHT may provide the reticle R into the exposure apparatus 20 (S140). When the exposure apparatus 20 is adjacent to the reticle inspection apparatus 30, the robot arm may provide the chamber 210 of the exposure apparatus 20 with the reticle R without the reticle pod 50. When the exposure apparatus 20 is spaced apart at more than a certain interval from the reticle inspection apparatus 30, the exposure apparatus 20 may be provided from the reticle inspection apparatus 30 with the reticle R loaded inside the outer and inner pods 52 and 54 of the reticle pod 50. The robot arm may separate the outer pod 52 from the inner pod 54 of the reticle pod 50.

Figure 10:
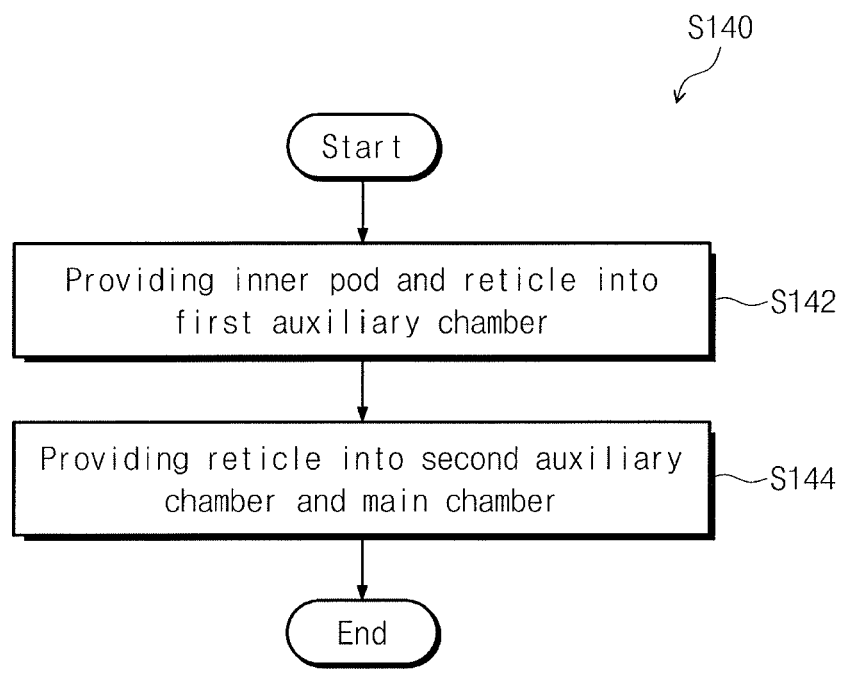
FIG. 10 illustrates a flow chart showing an example of a reticle providing step in FIG. 9.

FIG. 10 shows an example of the reticle providing operation S140 in FIG. 9. Referring to FIG. 10, the operation S140 of providing the reticle R into the exposure apparatus 20 may include an operation S142 of providing the reticle R and the inner pod 54 into the first auxiliary chamber 214, and an operation S144 of providing the reticle R alone into the second auxiliary chamber 216 and the main chamber 212.

First, the robot arm may provide the first auxiliary chamber 214 with the inner pod 54 and the reticle R inside the inner pod 54 (S142). In the first auxiliary chamber 214, t the robot arm may separate the inner pod 54 from the reticle R.

Afterwards, the robot arm may provide the reticle R into the second auxiliary chamber 216 and the main chamber 212 (S144). The rapid exchange device 260 may provide the reticle R onto the reticle chuck 242.

Referring back to FIG. 8, the exposure apparatus 20 may use the reticle R to perform an exposure process on the substrate W (S200). Referring to FIG. 9, the pod inspection module 330 of the reticle inspection apparatus 30 may use an air blowing method to inspect the reticle pod 50 (S150). The reticle pod 50 may be inspected before, during, or after the exposure process on the substrate W.

Figure 11:
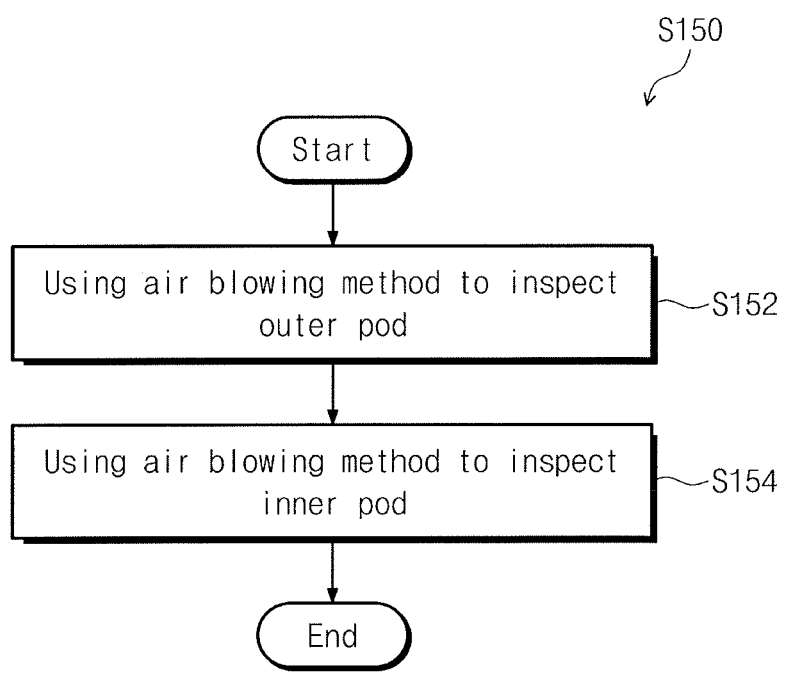
FIG. 11 illustrates a flow chart showing an example of an air blowing inspection step in FIG. 9.

FIG. 11 shows an example of the air blowing inspection operation S150 in FIG. 9. Referring to FIG. 11, the operation S150 of using an air blowing method to inspect the reticle pod 50 may include an operation S152 of using the air blowing method to inspect the outer pod 52 and an operation S154 of using the air blowing method to inspect the inner pod 54.

Referring to FIGS. 7 and 11 the pod inspection module 330 of the reticle inspection apparatus 30 may use the air blowing method to inspect the outer pod 52 (S152). When the reticle R is provided into the exposure apparatus 20, the outer pod 52 may be inspected using the air blowing method. When the reticle R and the inner pod 54 are provided into the first auxiliary chamber 214, the reticle inspection apparatus 30 may inspect the outer pod 52 that is transferred by the OHT to the reticle inspection apparatus 30, thus reducing a standby or idle time of the outer pod 52. The pod inspection module 330 of the reticle inspection apparatus 30 may use the air blowing method to inspect the first base 51 and the first cover 53 of the outer pod 52.

After that, the pod inspection module 330 may use the air blowing method to inspect the inner pod 54 (S154). When the reticle R is provided into the second auxiliary chamber 216 and the main chamber 212 and then used for an exposure process on the substrate W, i.e., during the exposure process, the reticle inspection apparatus 30 may inspect the inner pod 54 that is transferred by the robot arm and the OHT to the reticle inspection apparatus 30. When the reticle R is provided onto the reticle chuck 242, the inner pod 54 may be inspected using the air blowing method. The pod inspection module 330 of the reticle inspection apparatus 30 may use the air blowing method to inspect the second base 55 and the second cover 56 of the inner pod 54, which may reduce a standby or idle time of the inner pod 54. When an optical inspection method is used to inspect the inner pod 54 made of metal, the inner pod 54 and the particle 60 may have a small difference in image contrast therebetween. For example, the particle 60 may have a reduced image resolution when the inner pod 54 is made of metal. Alternatively, the entirety of the pod 50 may be inspected using the air blowing method during the exposure process.

Referring back to FIG. 9, the controller of the reticle inspection apparatus 30 may determine whether the particle 60 is absent on the reticle pod 50 (S160).

When the particle 60 is present on the reticle pod 50, the cleaning module 320 of the reticle inspection apparatus 30 may clean the reticle pod 50 (S170). When the cleaning of the reticle pod 50 is completed, the step S150 may be repeated to use the air blowing method to inspect the reticle pod 50, and then the step S160 may be repeated to determine whether the particle 60 is absent on the reticle pod 50.

When the particle 60 is absent on the reticle pod 50, the reticle pod 50 may be provided to the exposure apparatus 20 in operation S180. The reticle pod 50 may load and store the reticle R that is exchanged in the exposure apparatus 20. The OHT may transfer the reticle pod 50 to the reticle inspection apparatus 30.

Referring to FIG. 8, the reticle inspection module 310 of the reticle inspection apparatus 30 may reinspect the reticle R (S300). An optical inspection method may be used to reinspect the reticle R. The controller of the reticle inspection apparatus 30 may determine whether the particle 60 is absent on the reticle R. When the particle 60 is present on the reticle R, the cleaning module 320 may clean the reticle R. When the particle 60 is absent on the reticle R, the reticle R may be loaded in the reticle pod 50 and then transferred to the reticle storage 40.

Last, the reticle storage 40 may store the reticle pod 50 and the reticle R (S400). The reticle storage 40 may prevent the reticle pod 50 and the reticle R from being oxidized, e.g., by providing a nitrogen ($N_2$) gas to the reticle pod 50 and the reticle R.

As discussed above, a reticle management method according to some example embodiments may use an air blowing method to efficiently inspect a reticle pod, which may result in an increase in productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A reticle management method, comprising:
inspecting a reticle using a first inspection method;
inspecting a reticle pod using a second inspection method different from the first inspection method, the second inspection method including an air blowing method, and the reticle pod to store the reticle; and
cleaning the reticle pod when a particle is present on the reticle pod.

2. The reticle management method as claimed in claim 1, wherein the first inspection method includes an optical inspection method.

3. The reticle management method as claimed in claim 1, further comprising providing the reticle to an exposure apparatus after the reticle passes the first inspection method.

4. The reticle management method as claimed in claim 3, wherein the reticle pod includes a dual pod,
wherein the dual pod includes:
an outer pod; and
an inner pod that is inserted in the outer pod and to receive the reticle.

5. The reticle management method as claimed in claim 4, wherein providing the reticle to the exposure apparatus includes, after the reticle passes the first inspection method and the reticle pod passes the second inspection method:
providing the reticle and the inner pod into a first auxiliary chamber of the exposure apparatus; and
providing the reticle into a second auxiliary chamber and a main chamber of the exposure apparatus.

6. The reticle management method as claimed in claim 5, wherein inspecting the reticle pod includes:
inspecting the outer pod when the reticle and the inner pod are provided into the first auxiliary chamber; and
inspecting the inner pod when the reticle is provided into the second auxiliary chamber and the main chamber.

7. The reticle management method as claimed in claim 3, wherein the reticle pod is inspected during a substrate exposure process that uses the reticle.

8. The reticle management method as claimed in claim 1, further comprising:
determining whether a particle is absent on the reticle; and
cleaning the reticle when the particle is present on the reticle.

9. The reticle management method as claimed in claim 1, wherein cleaning the reticle pod includes a wet cleaning.

10. A reticle management method, comprising:
using an optical inspection method to inspect a reticle;
determining whether a particle is absent on the reticle;
cleaning the reticle when the particle is present on the reticle;
providing the reticle into an exposure apparatus when the particle is not present on the reticle;
using an air blowing method to inspect a reticle pod that is to store the reticle;
determining whether the particle is absent on the reticle pod; and
cleaning the reticle pod when the particle is present on the reticle pod.

11. The reticle management method as claimed in claim 10, wherein providing the reticle into the exposure apparatus when a particle is absent on the reticle and an inner pod of the reticle pod includes:
providing the reticle and the inner pod of the reticle pod into a first auxiliary chamber of the exposure apparatus; and
performing a substrate exposure process by providing the reticle into a second auxiliary chamber and a main chamber of the exposure apparatus.

12. The reticle management method as claimed in claim 11, wherein using the air blowing method to inspect the reticle pod includes:
inspecting an outer pod of the reticle pod when the inner pod and the reticle are provided into the first auxiliary chamber; and
inspecting the inner pod when the reticle is provided into the second auxiliary chamber and the main chamber.

13. The reticle management method as claimed in claim 10, wherein the reticle includes an extreme ultraviolet reticle.

14. The reticle management method as claimed in claim 10, wherein cleaning the reticle pod includes a wet cleaning.

15. A semiconductor device fabrication method, comprising:
inspecting a reticle and a reticle pod that is to receive the reticle;
using the reticle to perform a substrate exposure process; and
storing the reticle and the reticle pod when the reticle is exchanged,
wherein inspecting the reticle and the reticle pod includes:
inspecting the reticle using a first inspection method;
inspecting the reticle pod using a second inspection method different from the first inspection method, the second inspection method including an air blowing method; and
cleaning the reticle pod when a particle is present on the reticle pod.

16. The semiconductor device fabrication method as claimed in claim 15, wherein the reticle is inspected before the substrate exposure process, and the reticle pod is inspected during the substrate exposure process.

17. The semiconductor device fabrication method as claimed in claim 16, wherein inspecting the reticle pod includes:
inspecting an outer pod of the reticle pod when the inspected reticle is provided into an exposure apparatus; and
inspecting an inner pod of the reticle pod when the reticle is provided on a reticle chuck of the exposure apparatus.

18. The semiconductor device fabrication method as claimed in claim 15, wherein inspecting the reticle includes:
determining whether the particle is absent on the reticle; and
cleaning the reticle when the particle is present on the reticle.

19. The semiconductor device fabrication method as claimed in claim 15, after performing the substrate exposure process, further comprising reinspecting the reticle.

* * * * *